United States Patent
Delano et al.

(10) Patent No.: US 7,480,143 B2
(45) Date of Patent: Jan. 20, 2009

(54) VARIABLE-GAP THERMAL-INTERFACE DEVICE

(75) Inventors: Andrew D. Delano, Fort Collins, CO (US); Brandon A. Rubenstein, Loveland, CO (US); Eugene Miksch, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1167 days.

(21) Appl. No.: 10/419,373

(22) Filed: Apr. 21, 2003

(65) Prior Publication Data

US 2004/0207985 A1    Oct. 21, 2004

(51) Int. Cl.
*H05K 7/20* (2006.01)

(52) U.S. Cl. ............ 361/704; 361/707; 361/710; 165/80.3; 165/185; 257/713; 257/715

(58) Field of Classification Search ......... 361/678, 361/679, 686, 687, 688, 690, 700–712, 724–727; 257/706–727; 165/80.3, 80.4, 185, 905; 174/15.1, 16.3
See application file for complete search history.

(56) References Cited

U.S. PATENT DOCUMENTS

| | | | |
|---|---|---|---|
| 3,573,574 A * | 4/1971 | Davis | 257/715 |
| 4,067,042 A | 1/1978 | Novak et al. | |
| 4,226,281 A | 10/1980 | Chu | |
| 4,235,283 A | 11/1980 | Gupta | |
| 4,246,597 A | 1/1981 | Cole et al. | |
| 4,462,462 A | 7/1984 | Meagher et al. | |
| 4,561,011 A * | 12/1985 | Kohara et al. | 257/713 |
| 4,769,744 A | 9/1988 | Neugebauer et al. | |
| 5,010,949 A | 4/1991 | Dehaine | |
| 5,109,317 A | 4/1992 | Miyamoto et al. | |
| 5,161,089 A | 11/1992 | Chu et al. | |
| 5,162,974 A * | 11/1992 | Currie | 361/702 |
| 5,208,731 A | 5/1993 | Blomquist | |
| 5,280,409 A | 1/1994 | Selna et al. | |
| 5,396,402 A | 3/1995 | Perugini et al. | |
| 5,521,439 A | 5/1996 | Casati et al. | |
| 5,570,271 A | 10/1996 | Lavochkin | |
| 5,581,441 A | 12/1996 | Porter | |
| 5,615,735 A | 4/1997 | Yoshida et al. | |

(Continued)

FOREIGN PATENT DOCUMENTS

FR   0813383 A3   3/2002

(Continued)

OTHER PUBLICATIONS

The Article "Articulated Thermal Conductor for Semicondutor Packages" IBM Technical Disclosure Bulletin, Jan. 1978, vol. 20, Issue 8, pp. 3131-3132.*

(Continued)

*Primary Examiner*—Michael V Datskovskiy

(57) ABSTRACT

A method of transferring heat from a heat source to a heat sink using a variable-gap thermal-interface device is provided. The method comprises providing and rotating a multi-axis rotary spherical joint to an orientation to compensate for misalignment between the heat source and heat sink. The method further comprises providing a shim of thickness sufficient to fill a gap between the heat source and multi-axis rotary spherical joint, and inserting the shim to fill the gap.

27 Claims, 4 Drawing Sheets

U.S. PATENT DOCUMENTS

| | | |
|---|---|---|
| 5,621,615 A | 4/1997 | Dawson, et al. |
| 5,650,914 A | 7/1997 | DiStefano et al. |
| 5,705,850 A | 1/1998 | Ashiwake et al. |
| 5,714,738 A | 2/1998 | Hauschulz et al. |
| 5,734,556 A | 3/1998 | Saneinejad et al. |
| 5,777,852 A | 7/1998 | Bell |
| 5,920,457 A | 7/1999 | Lamb et al. |
| 5,932,925 A | 8/1999 | McIntyre |
| 5,990,552 A | 11/1999 | Xie et al. |
| 6,046,498 A * | 4/2000 | Yoshikawa ............... 257/706 |
| 6,115,253 A | 9/2000 | Clemens et al. |
| 6,175,499 B1 | 1/2001 | Adams et al. |
| 6,198,630 B1 | 3/2001 | Cromwell |
| 6,208,517 B1 | 3/2001 | Prince et al. |
| 6,219,239 B1 | 4/2001 | Mellberg et al. |
| 6,229,703 B1 | 5/2001 | Lee |
| 6,353,537 B2 | 3/2002 | Egawa |
| 6,390,475 B1 | 5/2002 | Eckblad et al. |
| 6,395,991 B1 | 5/2002 | Dockerty et al. |
| 6,462,951 B2 | 10/2002 | Letourneau |
| 6,496,371 B2 | 12/2002 | Winkel et al. |
| 6,510,054 B1 | 1/2003 | Chen |
| 6,518,507 B1 | 2/2003 | Chen |
| 6,634,890 B2 | 10/2003 | Peterson et al. |
| 6,691,768 B2 * | 2/2004 | Hsieh et al. ............... 165/80.3 |

FOREIGN PATENT DOCUMENTS

| | | | |
|---|---|---|---|
| JP | 360046056 A | * | 3/1985 |
| JP | 2000059072 A | | 2/2000 |
| WO | WO 9835540 | | 8/1998 |

OTHER PUBLICATIONS

The Article "Spherical Cooling Device" IBM Technical Disclosure Bulletin, Jul. 1991, vol. 34, Issue 2, pp. 1-3.*

The Article "Swivel Piston Conduction Module" IBM Technical Disclosure Bulletin, Dec. 1977, vol. 20, Issue 7, pp. 2707=2708.* http://www.bergquistcompany.com/tm_gap_pad_list.cfm, p. 1-2, (Mar. 3, 2003).

http://www.bergquistcompany.com/tm_gap_pad_detail.cfm, p. 1-2, (Mar. 3, 2003).

Rubenstein, Brandon A., "Heat Sink Hold-Down with Fan-Module Attach Location," filed Apr. 21, 2003.

Delano, Andrew D., "Variable-Wedge Thermal-Interface Device," filed Apr. 21, 2003.

Belady, Christian L. et al, Thermal Transfer Interface System and Methods, U.S. Appl. No. 10/074,642, filed Feb. 12, 2002.

* cited by examiner

VARIABLE-GAP THERMAL-INTERFACE DEVICE

CROSS-REFERENCE TO RELATED APPLICATIONS

This application is related to concurrently filed, co-pending, and commonly assigned U.S. patent application Ser. No. 10/419,386, titled "HEAT SINK HOLD-DOWN WITH FAN-MODULE ATTACH LOCATION," and to concurrently filed, co-pending, and commonly assigned U.S. patent application Ser. No. 10/419,406, titled "VARIABLE-WEDGE THERMAL-INTERFACE DEVICE," the disclosures of which are hereby incorporated herein by reference. This application is further related to co-pending and commonly assigned U.S. patent application Ser. No. 10/074,642, titled THERMAL TRANSFER INTERFACE SYSTEM AND METHODS," filed Feb. 12, 2002, the disclosure of which is hereby incorporated herein by reference.

FIELD OF THE INVENTION

This invention relates to heat transfer and more particularly to a variable-gap thermal-interface device.

DESCRIPTION OF RELATED ART

Traditionally, heat has been transferred between a heat source and a heat sink across non-uniform width gaps through the use of "gap pads," or silicone-based elastic pads. For example, The Bergquist Company (see web page http://www.bergquistcompany.com/tm_gap_list.cfm and related web pages) offers a range of conformable, low-modulus filled silicone elastomer pads of various thickness on rubber-coated fiberglass carrier films. This material can be used as a thermal-interface, where one side of the interface is in contact with an active electronic device. Relative to metals, these pads have low thermal conductivity. Furthermore, large forces are generally required to compress these pads. Moreover, silicone-based gap pads cannot withstand high temperatures.

Accordingly, it would be advantageous to have a thermal-interface device and method that provide high thermal conductivity across a wide range of non-uniform gap thicknesses under moderate compressive loading and high temperature conditions.

BRIEF SUMMARY OF THE INVENTION

In accordance with a first embodiment disclosed herein, a variable-gap thermal-interface device for transferring heat from a heat source to a heat sink is provided. The device comprises a multi-axis rotary spherical joint comprising a spherically concave surface having a first radius of curvature in slideable contact with a spherically convex surface having an identical first radius of curvature. The device further comprises a block having a proximal end rotatably coupled with the heat sink through the rotary spherical joint and having a distal end opposite the proximal end. The device further comprises a shim having a selectable substantially uniform thickness separating a first surface and a second surface opposite the first surface, such that the first surface thermally communicates with the distal end of the block and the second surface thermally communicates with the heat source.

In another embodiment, a method of transferring heat from a heat source to a heat sink using a variable-gap thermal-interface device is provided. The method comprises providing and rotating a multi-axis rotary spherical joint to an orientation to compensate for misalignment between the heat source and heat sink. The method further comprises providing a shim of thickness sufficient to fill a gap between the heat source and multi-axis rotary spherical joint, and inserting the shim to fill the gap.

DETAILED DESCRIPTION

Figure 1:
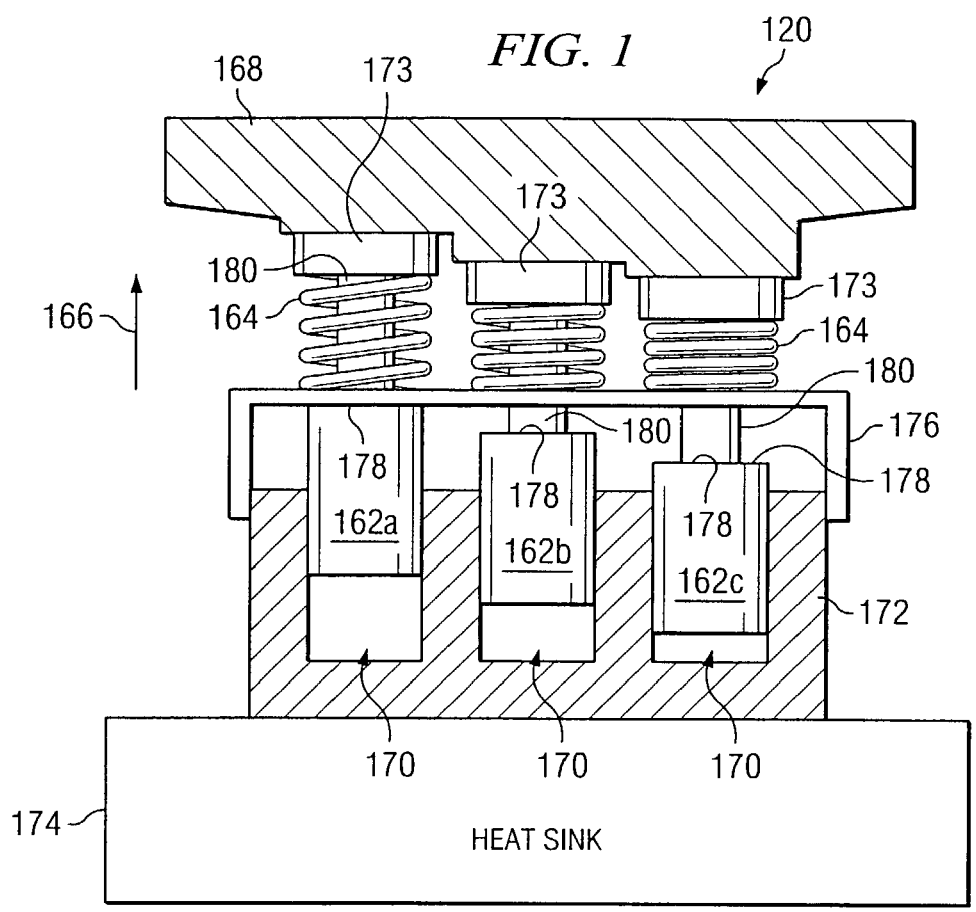
FIG. 1 is a schematic diagram representing a conformable thermal-interface device comprising an array of spring-loaded metal pistons sliding inside individual passageways of a thermal spreader.

FIG. 1 is a schematic diagram representing conformable thermal-interface device 120 comprising array of spring-loaded metal pistons 162a-162c sliding inside individual passageways 170 of thermal spreader 172. Compressive load is applied by array of springs 164 to bias pistons 162a-162c to move along direction 166 in thermal contact with heat source 168 having an uneven surface. Springs 164 compress between spreader 172 and piston head 173 to accommodate the uneven surface of heat source 168. In some embodiments, retaining element 176 couples with spreader 172, and pistons 162a-162c have shoulders 178 that abut retaining element 176 when extended as in piston 162a. Retaining element 176 forms apertures to accommodate passage of above-shoulder extensions 180 of pistons 162a-162c. Accordingly, the retaining embodiment of FIG. 1 ensures that pistons 162a-162c do not completely separate from spreader 172. Heat sink 174 may optionally couple to spreader 172 to facilitate cooling of heat source 168. While thermal-interface device 120 solves the problem of thermally contacting an uneven surface, the large relative void area between pistons 162a-162c reduces the effective thermal conductivity of thermal-interface device 120. Furthermore, these void areas cause the effective thermal conductivity to be anisotropic, which can degrade heat transfer, particularly from a non-uniform heat source. Additionally, thermal-interface device 120 provides only a limited range of motion. Moreover, devices of this complexity are relatively expensive to produce. For further detail see co-pending and commonly assigned U.S. patent application Ser. No. 10/074,642, titled THERMAL TRANSFER INTER- FACE SYSTEM AND METHODS," filed Feb. 12, 2002, the disclosure of which has been incorporated herein by reference.

Figure 2:
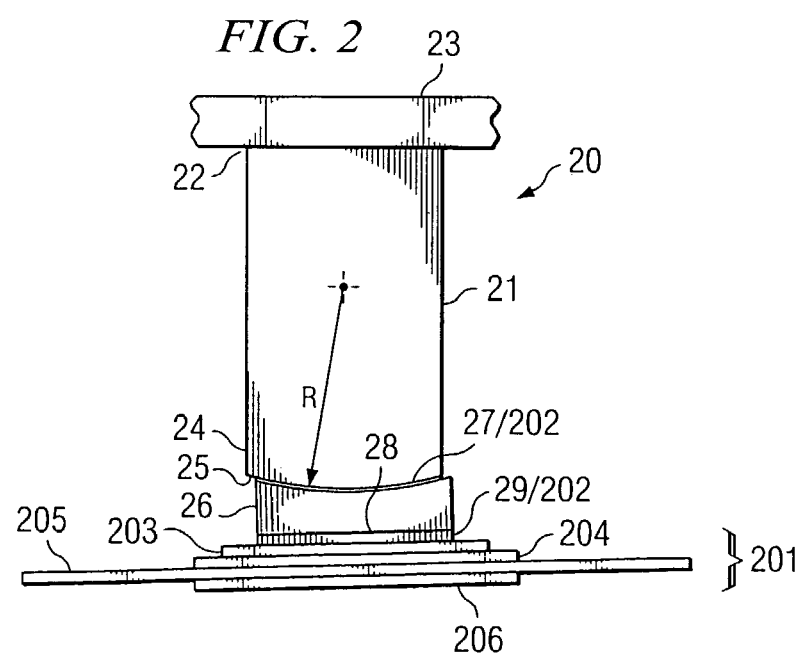
FIG. 2 is a perspective view representing a variable-gap thermal-interface device, in accordance with embodiments disclosed herein.

FIG. 2 is a perspective view representing variable-gap thermal-interface device 20, in accordance with embodiments disclosed herein. Heat sink extension 21 is a block of high-thermal-conductivity material rigidly attached or held under compression at upper end 22 to heat sink base 23. Alternatively, heat sink extension 21 can be made as an integral part of heat sink base 23. Lower end 24 of heat sink extension 21 has an integral spherically convex surface 25 of radius of curvature R. Socket block 26 of high-thermal-conductivity material comprises integral spherically concave socket 27 of matching radius of curvature R at its upper end, operable together in contact with spherically convex surface 25 to provide motion as a multi-axis spherical joint. Radius of curvature R can be any convenient radius, provided that radii of curvature R are matching for both spherically convex surface 25 and spherically concave surface 27. In some embodiments, convex surface 25 and concave socket 27 can be interchanged, such that convex surface 25 is integral with block 26 and concave socket 27 is integral with heat sink extension 21. In alternative embodiments, multi-axis spherical joint comprising spherically convex surface 25 and spherically concave surface 27 can be replaced by a single-axis cylindrical joint or by multiply-cascaded cylindrical joints, providing one or more rotational degrees of freedom.

Shim 29 is a plate of high thermal conductivity material that contacts flat surface 28 of the lower end of socket block 26. The high conductivity materials of heat sink extension 21, socket block 26, and shim 29 can be either similar or dissimilar, and are typically metals, although they can alternatively be selected from insulators, composite materials, semiconductors and/or other solid materials as appropriate for a specific application. Interface device 20 can be dimensionally scalable over a range potentially from nanometers to meters. Interface device 20 is pressed against heat source 201 under compression from heat sink base 23. Typically, heat source 201 contains integrated circuit (processor) chip 204 covered by processor lid 203 and mounted on circuit board 205. Heat source 201 is attached to and supported by bolster plate 206. The thickness of shim 29 is selected to sufficiently fill a gap between heat source 201 and socket block 26, thus providing distance compensation between heat sink base 23 and heat source 201. The interface between spherically convex surface 25 and spherically concave surface 27 forms a rotary joint that compensates for angular misalignment about any combination of axes between the planes of heat sink base 23 and heat source 201. Thermal-interface material 202, typically high conductivity grease, is optionally applied to enhance heat conduction and sliding motion at the interfaces between spherically convex surface 25, spherically concave surface 27, and shim 29.

Figure 3:
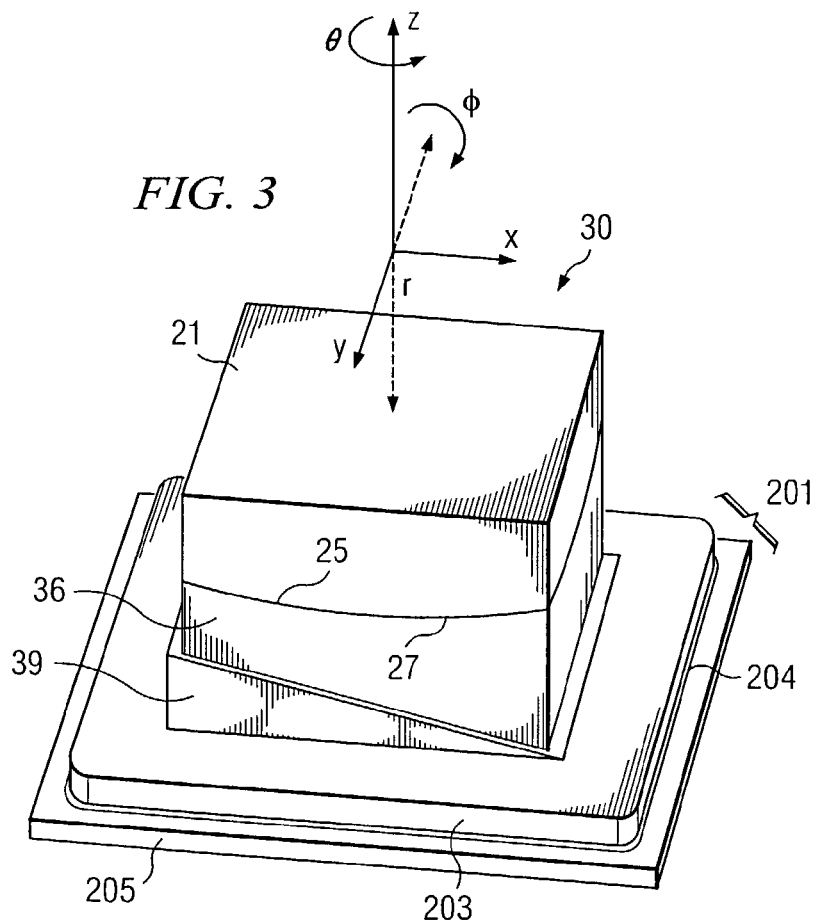
FIG. 3 is a perspective view representing a wedge-socket variable-gap thermal-interface device.

FIG. 3 is a perspective view representing a wedge-socket variable-gap thermal-interface device 30. As in FIG. 2, thermal-interface device 30 comprises heat sink extension 21 with flat upper end adjacent heat sink base 23 (not shown in FIG. 3) and lower spherically convex surface 25 of radius R. Wedge-socket 36 has an upper spherically concave surface 27 of radius R in rotational sliding contact with spherically convex surface 25. For convenience, coordinate axes are shown in FIG. 3, such that x, y, and z are orthogonal rectangular axes fixed with respect to wedge-socket 36 and rotating through angular coordinates θ and φ about the common center of curvature of spherically convex surface 25 and spherically concave surface 27. Wedge-socket 36 has a lower flat face inclined at a wedge angle relative to the x-axis of the xyz rotating coordinate system.

Wedge 39 has an upper surface inclined at the same wedge angle and in sliding contact with the lower inclined flat face of wedge-socket 36. Although the lower flat face of wedge 39 can be inclined at any angle relative to the xyz rotating coordinate system, for convenience it is oriented parallel to the rotating xy plane. Wedge 39 contacts heat source 201 and provides heat transfer from heat source 201 through solid, high thermal-conductivity material of wedge-socket 36 and heat sink extension 21 to heat sink base 23 (not shown in FIG. 3). The interface between wedge 39 and wedge-socket 36 may be filled with a thermal-interface material, typically thermal grease or paste, to reduce both thermal resistance and friction. Heat source 201 as shown in FIG. 3 typically comprises the same layers as shown in FIG. 2, namely processor chip 204, processor lid 203, and circuit board 205.

Figure 4:
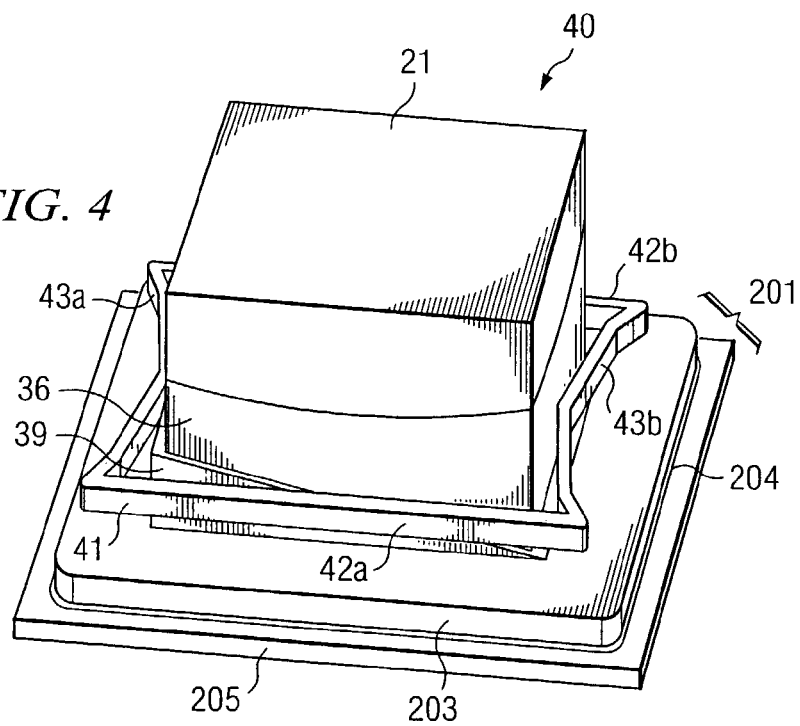
FIG. 4 is a perspective view representing a wedge-socket variable-gap thermal-interface device in which the wedge and wedge-socket are held together by a spring clip.

FIG. 4 is a perspective view representing wedge-socket variable-gap thermal-interface device 40, comprising wedge-socket variable-gap thermal-interface device 30 in which wedge 39 and wedge-socket 36 are spring-loaded in the x-direction by spring clip 41. In one variation, spring clip 41 is shaped approximating a deformed rectangular frame. Two opposite sides 42a, 42b may be but need not be straight and parallel as shown in FIG. 4. Two remaining opposing sides 43a, 43b are bent inward toward one another and are tempered to exert a compressive squeezing force toward one another. In wedge-socket variable-gap thermal-interface device 40, spring clip 41 is aligned, so that a first inwardly bent side, for example side 43a, presses against the largest area vertical surface (normal to the x-axis) of wedge 39, and a second inwardly bent side, for example side 43b, presses against the largest area vertical surface (also normal to the x-axis) of wedge-socket 36. Compressive forces applied by spring clip 41 generate shear force components along the incline of wedge 39, causing the contacting inclined surfaces of wedge 39 and wedge-socket 36 to slide across one another, thereby extending the length of the z-axis wedge-socket variable-gap thermal-interface device 40 to fill the available gap between heat sink extension 21 and heat source 201. This simultaneously drives the wedge components to become offset relative to one another along the x-axis, reducing the inclined contact area. When the gap is filled, z-axis compressive forces prevent further offset between wedge 39 and wedge-socket 36. Spring clip 41 can be used similarly to apply shear forces to sliding wedge elements in other applications, including heat transfer and non-heat transfer applications.

The socket end of wedge-socket 36 is spherically concave with radius of curvature R in the present example, and contacts a surface of heat sink extension 21 which is spherically convex in the present example with the same radius of curvature R. This provides adjustment in angle about three axes. Again, the interfaces between wedge-socket 36 and heat sink extension 21 and between contacting inclined surfaces of wedge 39 and wedge-socket 36 may be filled with a thermal-interface material, typically thermal grease or paste, to reduce both thermal resistance and sliding friction. Wedge-socket variable-gap thermal-interface devices 30 and 40 are potentially scalable dimensionally over a range from nanometers to meters.

Figures 5A, 5B:
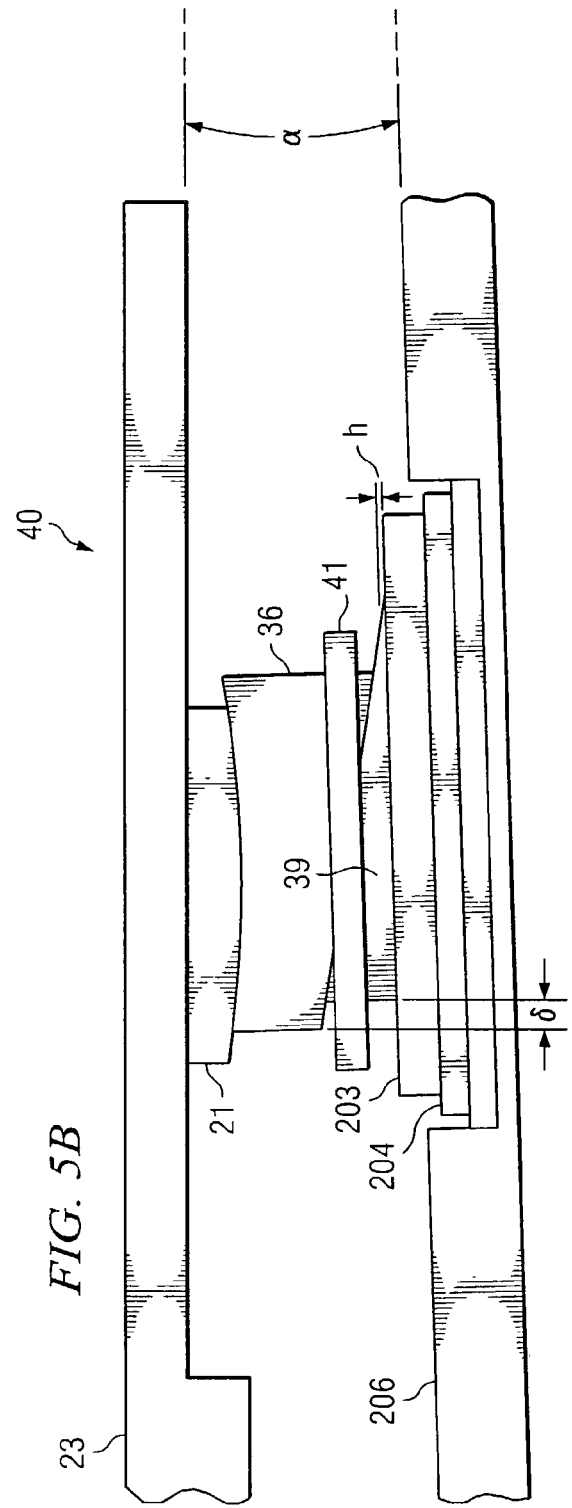
FIG. 5A is an exploded schematic representation of a wedge-ball variable-gap thermal-interface device.
FIG. 5B is a schematic diagram illustrating adjustments that can be performed using a wedge-socket variable-gap thermal-interface device to compensate for a situation where heat source and heat sink base may lie in non-parallel planes and/or where the z-axis distance between heat source and heat sink base is non-uniform.

FIG. 5A is an exploded schematic representation of wedge-ball variable-gap thermal-interface device 50, which is a variation of wedge-socket variable-gap thermal-interface device 40. In the example of FIG. 5A, heat sink extension 51 has a lower spherically concave socket of radius of curvature R rotationally matching spherically convex ball of radius R on the upper surface of wedge-ball 56. Wedge-ball 56 has a flat inclined lower surface configured to slide across the top inclined surface of wedge 39. Spring clip 41 is disposed to spring-load wedge-ball 56 and wedge 39 with a shear force. As shown in the example of FIG. 5A, spring clip 41 can be secured to wedge-ball 56 using set screw 55 or other traditional fastener. As in previously described examples, the interfaces between wedge-ball ball 56 and heat sink extension 51 and between contacting inclined surfaces of wedge 39 and wedge-ball 56 may be filled with a thermal-interface material, typically thermal grease or paste, to reduce both thermal resistance and sliding friction.

FIG. 5B is a schematic diagram illustrating adjustments that can be performed using wedge-socket variable-gap thermal-interface device 40 to compensate for a situation where heat source 203-204 and heat sink base 23 may lie in non-parallel planes and/or where the z-axis distance between heat source 203-204 and heat sink base 23 is non-uniform. Heat source 203-204 is supported by bolster plate 206. All adjustments are performed under compressive loading between heat sink base 23 and bolster plate 206. Spring clip 41 generates a shear force, that causes the wedged surfaces of wedge-socket 36 and wedge 39 to slide across one another. To compensate for tilt angle α between heat source 203-204 and heat sink base 23, wedge-socket 36 is rotated relative to the spherically convex surface of heat sink extension 21 through rotation angle α. As illustrated, this is accompanied by a corresponding offset of wedge-socket 36 relative to heat sink extension 21. Although for simplicity of illustration, tilt angle α is shown in the xz-plane, in the general case, tilt angle α can lie in any plane containing the common center of curvature of the spherically convex surface of heat sink extension 21 and the spherically concave surface of wedge-socket 36.

To compensate for a z-axis gap of width h, compressive loading by spring clip 41 between heat sink base 23 and bolster plate 206 generates a shear force component that drives an offset perpendicular to the z-axis between the wedged components of wedge 39 and wedge-socket 36. Because of the wedge geometry, this extends the z-axis length of combined wedge 39 and wedge-socket 36. When the z-axis extension reaches an incremental length h, then the gap is filled, and the corresponding offset between the wedged components wedge 39 and wedge-socket 36 is δ, where the ratio h/δ is just the incline slope of the wedge. Compressive z-axis loading between heat sink base 23 and bolster plate 206 then prevents further sliding offset between wedge 39 and wedge-socket 36.

Figure 6:
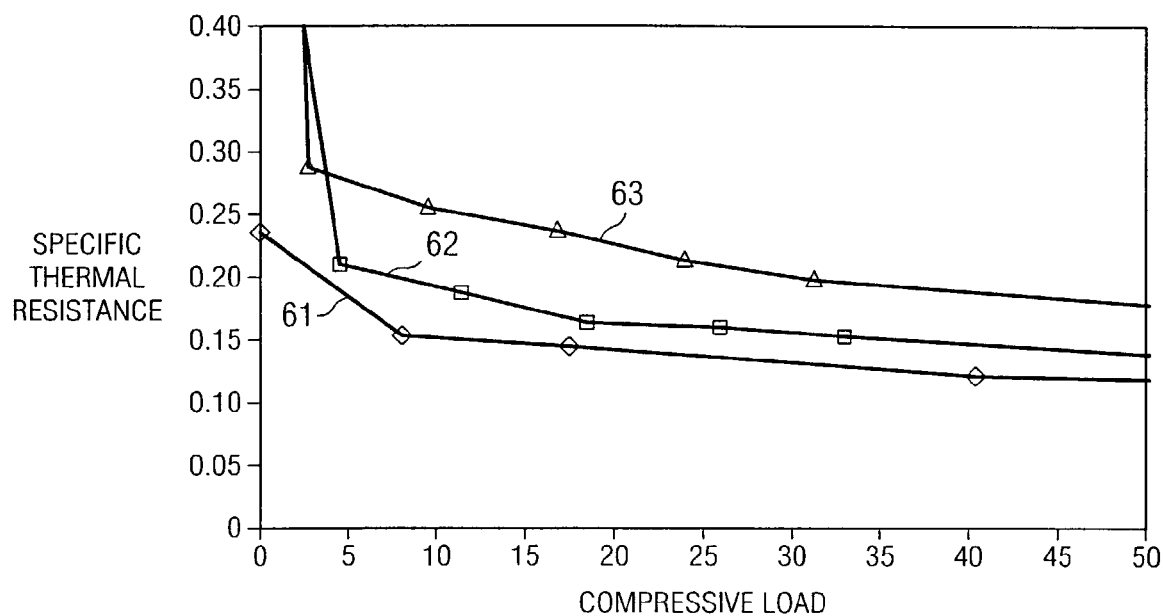
FIG. 6 is a graphic representation comparing the measured heat transfer performance of a wedge-socket variable-gap thermal-interface device with that of an alternative configuration.

FIG. 6 is a graphic representation comparing the measured heat transfer performance of a wedge-socket variable-gap thermal-interface device, for example wedge-socket variable-gap thermal-interface device 40, with that of an alternative configuration similar to that illustrated in FIG. 1. The vertical axis plots specific thermal resistance in relative units normalized per unit area, as a function of compressive load in arbitrary normalized pressure units along the horizontal axis. Pressure is applied uniformly across the respective heat transfer surfaces. Curve 61 represents the performance of a configuration similar to wedge-socket variable-gap thermal-interface device 40, curve 62 represents performance of a device similar to that of FIG. 1, in which the piston is all copper, and curve 63 represents performance of a device similar to that of FIG. 1, in which the piston is all aluminum. In accordance with the data plotted in FIG. 6, curve 61 advantageously shows a relatively lower thermal resistance that is reached at lower applied pressures than exhibited in either of curves 62 or 63.

Figure 7:
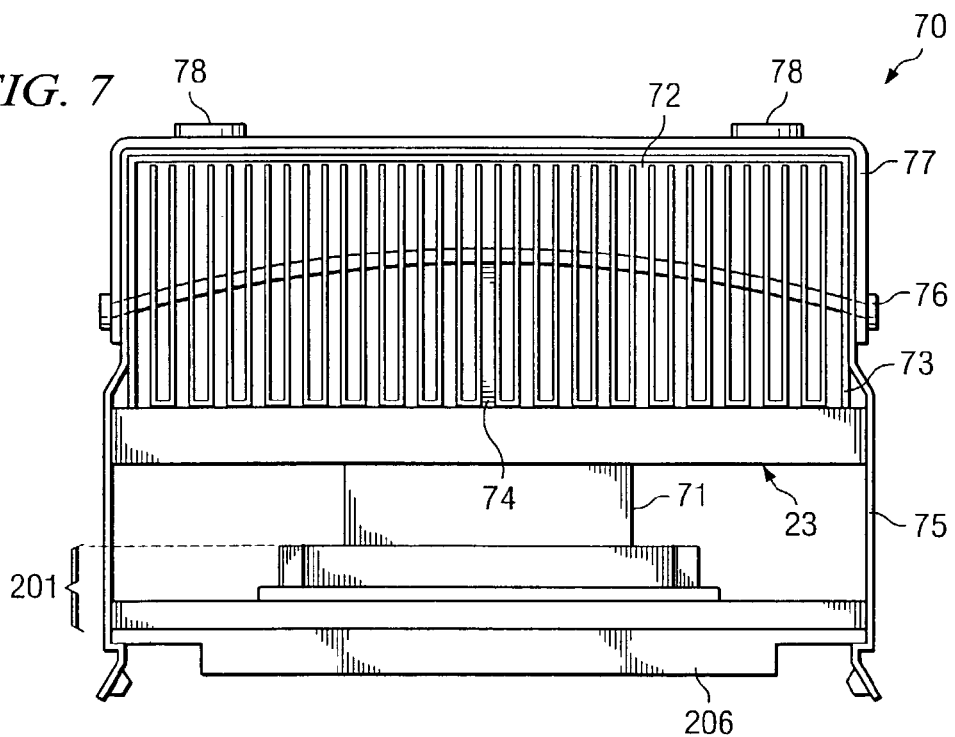
FIG. 7 is a schematic diagram illustrating a heat sink hold-down embodiment according to an incorporated disclosure.

In practice, the compressive load between the heat sink base and bolster plate in any of the embodiments disclosed herein can be provided by any of a variety of heat sink hold-down devices. An advantageous configuration of such a hold-down device is disclosed in concurrently filed, co-pending, and commonly assigned U.S. patent application Ser. No. 10/419,386, the disclosure of which has been incorporated herein by reference. FIG. 7 is a schematic diagram illustrating heat sink hold-down device 70 according to the incorporated disclosure. Bolster plate 206 supports heat source 201. Heat sink 73 includes heat sink base 23 attached to central post 74, and finned structure 72. Cage 75 is attached with clips to bolster plate 206 and supports lever spring 76 through clearance slots. Cap 77 rigidly attached to cage 75 using screws or other fasteners 78 presses downward on the ends of lever spring 76, which transfer the load through a bending moment to central post 74. Central post 74 is disposed to distribute the load symmetrically across the area of heat sink base 23.

In some embodiments, heat sink extension 71 transfers the compressive loading between heat sink base 23 and heat source 201. Alternatively, a variable-gap thermal-interface device in accordance with the present embodiments, for example variable-gap thermal-interface device 20 or wedge-socket variable-gap thermal-interface device 40, is coupled thermally and mechanically with heat sink hold-down device 70, replacing heat sink extension 71 in its entirety. In this configuration, heat sink hold-down device 70 applies the loading that holds variable-gap thermal-interface device 20, 40 under compression against heat source 201.

Embodiments disclosed herein address the problem of minimizing the thermal resistance between a heat source and a heat sink for a situation in which the heat source and the heat sink may lie in non-parallel planes and/or where the distance between heat source and heat sink is non-uniform. This is a problem that arises especially when attempting to conduct heat from more than one heat source to a single heat sink.

What is claimed is:

1. A variable-gap thermal-interface device for transferring heat from a heat source to a heat sink, said device comprising:
   a multi-axis rotary spherical joint comprising a spherically concave surface having a first radius of curvature in slideable contact with a spherically convex surface having said first radius of curvature;
   a block having a proximal end rotatably coupled with said heat sink through said rotary spherical joint and having a distal end opposite said proximal end; and
   a shim having a selectable substantially uniform thickness in at least one direction separating a first surface and a second surface opposite said first surface, said first surface thermally communicating with said distal end of said block and said second surface thermally communicating with said heat source.

2. The device of claim 1 wherein said spherically concave surface is integral with said block.

3. The device of claim 1 wherein said spherically convex surface is integral with said block.

4. The device of claim 1 wherein said multi-axis rotary spherical joint is rotated to an orientation that compensates for angular misalignment between said heat source and said heat sink.

5. The device of claim 1 wherein said shim is oriented such that said thickness is substantially parallel to an axis connecting said distal end with said proximal end of said block.

6. The device of claim 1 wherein said thickness of said shim is selected to sufficiently fill a gap between said block and said heat source.

7. The device of claim 1 further comprising a thermal-interface material applied to interfaces within said multi-axis rotary spherical joint and to interfaces adjacent surfaces of said shim.

8. The device of claim 1 further comprising a heat sink extension thermally and mechanically coupled between said heat sink and said multi-axis rotary spherical joint.

9. The device of claim 1 wherein said block, said shim, and said multi-axis rotary spherical joint consist substantially of high thermal conductivity solid materials.

10. The device of claim 9 wherein said solid high thermal conductivity materials are selected from the group consisting of metals, insulators, semiconductors, and composite materials.

11. The device of claim 10 operable to transfer heat from said heat source through said thickness of said shim, through said block from said distal end to said proximal end, and through said rotary spherical joint to said heat sink.

12. The device of claim 11 further operable to transfer heat under compressive loading applied between said heat sink and said heat source.

13. The device of claim 12 coupled mechanically and thermally with a heat sink hold-down device, wherein said heat sink hold-down device is operable to apply said compressive loading.

14. The device of claim 1 wherein said heat source comprises an integrated circuit chip.

15. A method of transferring heat from a heat source to a heat sink using a variable-gap thermal-interface device, said method comprising:
   providing a multi-axis rotary spherical joint;
   rotating said multi-axis rotary spherical joint to an orientation to compensate for misalignment between said heat source and said heat sink;
   providing a shim of thickness sufficient to fill a gap between said heat source and said multi-axis rotary spherical joint; and
   inserting said shim to fill said gap.

16. The method of claim 15 further comprising applying thermal-interface material to interfaces within said multi-axis rotary spherical joint and to interfaces adjacent surfaces of said shim.

17. The method of claim 15 further comprising transferring heat from said heat source through said shim and through said multi-axis rotary spherical joint to said heat sink.

18. The method of claim 15 further comprising applying a compressive load between said heat sink and said heat source.

19. The method of claim 18 wherein said applying a compressive load further comprises:
   providing a heat sink hold-down device operable to apply a compressive load;
   coupling said heat sink, said multi-axis rotary spherical joint, said shim, and said heat source mechanically and thermally with said heat sink hold-down device; and
   applying a compressive load between said heat sink and said heat source using said heat sink hold-down device.

20. A wedge socket variable gap thermal interface apparatus comprising:
   an wedge socket extension comprising a thermally conductive material having a proximal surface thermally communicating with a heat sink, and articulating with a distal planar surface, inclined at an angle of a wedge, through a rotary spherical joint such that the articulating surfaces have the same radius of curvature;
   a shim comprising thermally conductive material of selectable thickness having a first planar surface inclined at an angle of a wedge and thermally communicating with the distal planar surface of the wedge socket extension, and a second surface thermally communicating with a heat source and opposite the first planar surface;
   a spring clip approximately rectangular in shape having a first side opposite a second side and the first and the second sides bending inwardly and exerting a spring like compressive force toward one another;
   the spring clip exerting the compressive force on opposite surfaces of the wedge socket extension and the shim causing the distal planar surface of the wedge socket extension and the first planar surface of the shim to move toward one another and to close and obliterate a gap between them forming a thermally communicating joint.

21. The apparatus of claim 20 wherein the rotary spherical joint can either be concave up or concave down.

22. The apparatus of claim 20 wherein the spring clip is attached to the wedge socket extension by a means for attaching.

23. The apparatus of claim 20 wherein the rotary spherical joint is rotated to an orientation that compensates for angular misalignment between the heat source and the heat sink.

24. The apparatus of claim 20 wherein the spring clip compresses the wedge surfaces together thereby adjusting for variable vertical displacement between the heat source and the heat sink.

25. The apparatus of claim 20 coupled mechanically and thermally with a heat sink hold-down device, wherein the heat sink hold-down device is operable to apply compressive loading.

26. The apparatus of claim 20 further comprising a thermal-interface material applied to interfaces within the rotary spherical joint and to interfaces adjacent to surfaces of the shim.

27. The apparatus of claim 20 operable to transfer heat from the heat source through the shim, through the wedge socket extension to the heat sink.

* * * * *

UNITED STATES PATENT AND TRADEMARK OFFICE
CERTIFICATE OF CORRECTION

| | | |
|---|---|---|
| PATENT NO. | : 7,480,143 B2 | Page 1 of 1 |
| APPLICATION NO. | : 10/419373 | |
| DATED | : January 20, 2009 | |
| INVENTOR(S) | : Andrew D. Delano et al. | |

It is certified that error appears in the above-identified patent and that said Letters Patent is hereby corrected as shown below:

In column 5, line 9, before "56" delete "ball".

Signed and Sealed this

Nineteenth Day of May, 2009

JOHN DOLL
*Acting Director of the United States Patent and Trademark Office*